United States Patent [19]

Goldberg

[11] Patent Number: 4,961,955
[45] Date of Patent: Oct. 9, 1990

[54] SOLDER PASTE APPLICATOR FOR CIRCUIT BOARDS

[75] Inventor: Steven R. Goldberg, Sparta, N.J.

[73] Assignee: ITT Corporation, New York, N.Y.

[21] Appl. No.: 287,181

[22] Filed: Dec. 20, 1988

[51] Int. Cl.$^5$ .............................................. B05D 3/12
[52] U.S. Cl. ...................................... 427/57; 427/96;
427/294; 118/410; 118/421; 118/503; 118/71;
118/600; 118/612
[58] Field of Search .......................... 427/57, 96, 294;
118/410, 421, 503, 71, 600, 612

[56] References Cited

U.S. PATENT DOCUMENTS

| | | | |
|---|---|---|---|
| *3,088,434 | 5/1963 | Sprague | 118/410 |
| 3,194,681 | 7/1965 | Nicholson | 427/57 |
| 4,307,128 | 12/1981 | Nagano | 427/57 |
| 4,515,297 | 5/1985 | Schoenthaler | 222/160 |
| 4,607,782 | 8/1986 | Mims | 228/180.2 |
| 4,622,239 | 11/1986 | Schoenthaler | 427/95 |
| 4,636,406 | 1/1987 | Leicht | 427/96 |
| 4,677,937 | 7/1987 | Tee | 118/503 |
| 4,678,169 | 7/1987 | Fishman | 118/503 |
| 4,679,526 | 7/1987 | Dziedzic | 118/503 |
| 4,693,209 | 9/1987 | Leicht | 118/213 |
| 4,704,305 | 11/1987 | Berger | 427/96 |

FOREIGN PATENT DOCUMENTS 583823 12/1977 U.S.S.R. .............................. 118/410

OTHER PUBLICATIONS

L. A. Willard, "Positive Displacement Dispenser", IBM Technical Disclosure Bulletin, vol. 18, No. 1, Jun. 1975, pp. 66–67.

Primary Examiner—Shrive Beck
Assistant Examiner—Vi Duong Dang
Attorney, Agent, or Firm—Thomas N. Twomey; Mary C. Werner

[57] ABSTRACT

A solder paste applicator for applying solder to a selected area of a printed circuit board on which electronic components are mounted. The applicator includes a housing with a plate mounted in one end. The plate has a pattern of holes through it corresponding to the pattern of solder to be applied to the board. The housing has movable legs mounted to the outer surface for positioning the plate a distance from the surface of the board which corresponds to the thickness of the solder to be applied. The solder is held in a reservoir above the patterned plate. A piston is positioned in the housing and is pushed against the reservoir for dispensing the solder.

17 Claims, 3 Drawing Sheets

SOLDER PASTE APPLICATOR FOR CIRCUIT BOARDS

BACKGROUND OF THE INVENTION

This invention relates to soldering of printed circuit boards and, more particularly, to a solder paste applicator incorporating a patterned screen for applying solder to a printed circuit board for soldering surface mounted components thereon.

At present there are two primary methods of assembling electronic components to a printed circuit board (PCB). In one method, referred to as the leaded through-hole method, the components have wire leads protruding therefrom. The leads are placed through holes in the board and soldered to the circuit on the opposite side of the board. For most multi-leaded electronic components the size of the body is dependent on the number of leads that it has. The required size and spacing of the holes in the board limits the minimum distance from one lead to the next to approximately 0.100 inches.

The other more recent method involves mounting of the components directly onto the surface of the circuit board. Since there are no leaded through holes, the lead pitch can be reduced and is typically 0.050 to 0.025 inches. This allows the component body size to be reduced to as much as one-third the size required for the leaded through-hole method.

In the leaded through-hole method, the leads are soldered to the board by passing the underside of the board through a tank of molten solder. The molten solder is pushed up into the holes in the board. The board is then cooled and the solder solidifies in the holes.

Surface mounted components are soldered by applying a solder paste to the board through a fine mesh screen or thin metal stencil to control the placement of the paste on the board. When the screen is used, selected spaces in the mesh are closed to create a pattern in the open spaces which corresponds to the pattern to be placed on the board. When the stencil is used, the pattern to be created is etched directly through the metal. The screen or stencil is positioned on the board and the solder paste is spread over the screen or stencil and pushed through the openings onto the PCB by means of a squeegee. The screen or stencil is then removed, leaving the desired pattern of paste on the board. The thickness of the paste is controlled by the thickness of the screen or stencil.

In an alternate method, the solder paste is dispensed through a small diameter tube in the desired pattern directed onto the PCB. The tube may be attached to a programmable positioning system in which the paste is automatically applied to the PCB.

However, the screen print method requires that the surface of the board to which the paste is applied be free of irregularities or projections so that the screen can lay flat on the PCB. In addition, the region surrounding the perimeter of the area to be printed must be rectangular and large enough to allow room for the frame that supports the screen and to allow over-travel for the squeegee. Also, since the thickness of the deposited paste is determined by the thickness of the screen, a new screen must be made every time the thickness of the paste layer is changed. The screen must be reloaded and positioned for each surface mount board. The same disadvantages exist when using a stencil.

Although the small diameter tube solder paste dispensers can apply the paste over a range of thicknesses by using multi-orifice dispensing heads, the process is slow and inefficient for the quantities of paste required for a typical board.

It is therefore an object of the present invention to provide a solder paste application device which overcomes the disadvantages of the prior art.

It is an additional object of the present invention to provide a solder paste applicator in which the amount of paste can be regulated for each application.

It is yet another object of the present invention to provide a solder paste applicator in which varying thicknesses of paste can be applied without changing parts in the applicator.

It is still an additional object to provide a solder paste application device which allows for a reduced border area surrounding the pattern to be printed.

It is an additional object of the present invention to provide a method for applying a solder paste to a printed circuit board in a one-step operation.

These objects and others which will become apparent hereinafter are accomplished by the present invention which provides an apparatus for applying solder paste to a surface including a housing having two ends and an outer peripheral surface joining the ends, a plate removably positioned in the chamber substantially parallel to and spaced a predetermined distance from one of the ends, the plate having holes therethrough displaying a predetermined pattern, a reservoir for holding a solder paste located in the chamber and adjacent the plate and means located in the other of the ends for dispensing the solder paste through the holes and onto the surface.

The present invention also provides a method of applying solder paste to a printed circuit board including filling a reservoir housed in a chamber with a solder paste, forming a predetermined pattern of holes in a plate, positioning the plate at one end of the chamber adjacent the reservoir a predetermined distance from one end of the chamber, removing air bubbles from the solder paste, positioning the one end of the chamber on a surface of the board to be soldered, and applying pressure to the paste to force the paste to extrude through the holes and be deposited on the board to a predetermined thickness in the predetermined pattern.

BRIEF DESCRIPTION OF THE DRAWING

The above-mentioned and other features and objects of this invention will become more apparent by reference to the following description taken in conjunction with the accompanying drawing in which.

DESCRIPTION OF THE PREFERRED EMBODIMENT

Figure 1:
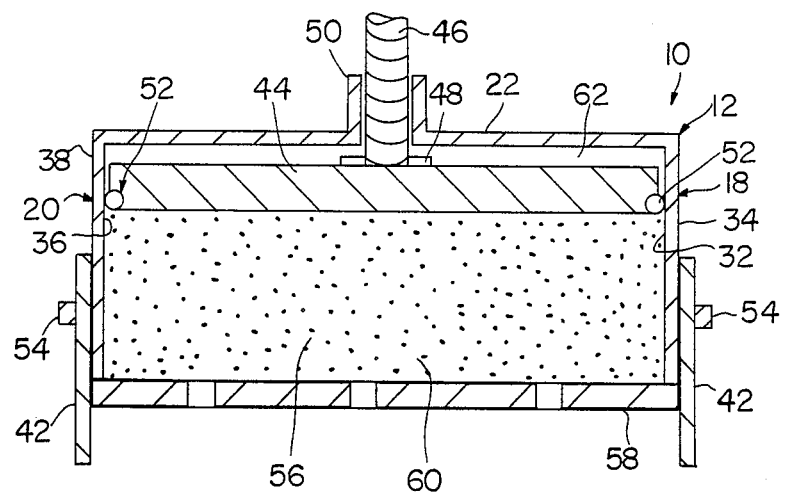
FIG. 1 is a cross-sectional view of a solder paste applicator of the present invention.
Figure 2:
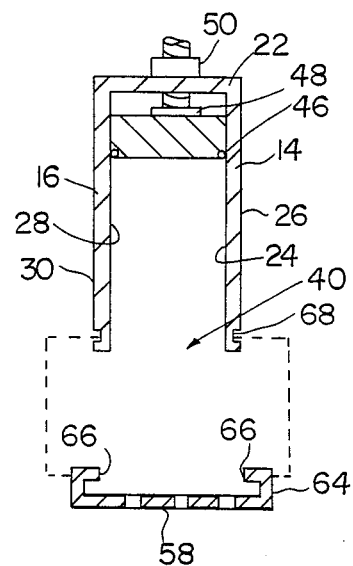
FIG. 2 is a cross-sectional view of one end of the solder paste applicator of the present invention.

In FIGS. 1 and 2 there is shown a solder paste applicator 10 including a housing 12 having side walls 14, 16, end walls 18, 20 and a top 22 joining the side and end walls. The side wall 14 has an inner surface 24 and an outer surface 26. The side wall 16 has an inner surface 28 and an outer surface 30. The end wall 18 has inner and outer surfaces 32, 34, respectively, and the end wall 20 has inner and outer surfaces 36, 38 respectively.

The housing 12 has an open bottom section 40. A patterned plate 58 is positioned in the bottom section 40. A leg 42 is slidably mounted to each end wall 18, 20 by means of a screw 54.

A piston 44 is located in the housing 12 and extends between the inner surfaces 24, 28, 32 and 36. The piston 44 is movable between the top 22 and the bottom section 40. A threaded shaft 46 joins the piston 44 at mounting means 48 at one end. The other end of the shaft 46 extends through an opening or port in the top 22 which is bounded by a cylindrical wall 50 being threaded on its inner surface to correspond to the threads on the shaft 46. A seal 52 is mounted along the lower outer periphery of the piston 44 and contacts the walls 24, 28, 32 and 36.

A reservoir 56 is defined by the inner surfaces 24, 28, 32 and 36, the patterned plate 58 and the lower surface of the piston 44. The reservoir holds a solder paste 60.

A chamber 62 is located between and bounded by the upper surface of the piston 44, the inwardly facing surface of top 22 and the portions of the surfaces 24, 28, 32, 36 extending therebetween.

The housing 12 has a generally rectangular configuration. The corners of the housing 12 at the junctures of the side and end walls are rounded to facilitate machining both the housing and the plate 58. More importantly, the rounded configuration of the corners enables the seal 52 to engage the side walls in a substantially air tight manner thus preventing air from entering the reservoir 56 from the chamber 62 and preventing the solder paste 60 from being forced into the chamber 62 during movement of the piston 44 against the solder paste 60. Although the applicator is shown as having a generally rectangular configuration, the device is not restricted to this form.

FIG. 2 is a cross-sectional view of one end of the solder paste applicator 10 showing the side walls 14, 16 and the patterned plate 58 spaced from the bottom section 40. The patterned plate 20 has opposed U-shaped sides 64. The ends 66 of the U-shaped sides are positioned in the applicator 10 in grooves 68 extending horizontally along the lower portion of the surfaces 26, 30 of the side walls 14, 16. The other end of the applicator 10 has substantially the same configuration.

Figure 3:
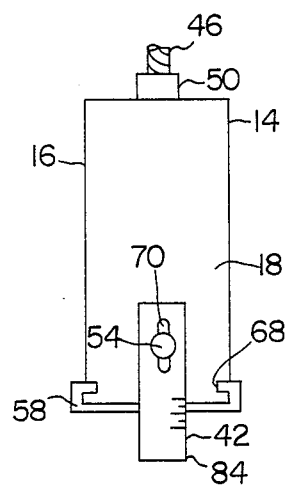
FIG. 3 is an end view of the solder paste applicator.

FIG. 3 is a view of the applicator 10 from end wall 18 with the plate 58 positioned in the grooves 68. The leg 42 is joined to the end wall 18 by means of the screw 54 which extends into the wall 18. The leg 42 has an opening 70 therethrough which permits the leg to be slidably moved so as to extend beyond the plate 58 a predetermined distance. The leg 42 has graduated markings along one side to measure the distance from the outwardly facing surface of plate 58 to the lower end 84 of the leg 42. The lower end 84 of the leg 42 rests on the circuit board during solder paste application. When positioned in this manner, the distance from the surface of the circuit board to the outwardly facing surface of the plate 58 corresponds to the thickness of solder paste which will be applied by the applicator 10. A second leg 42 is mounted to the end wall 20 in substantially the same manner.

Figure 4:
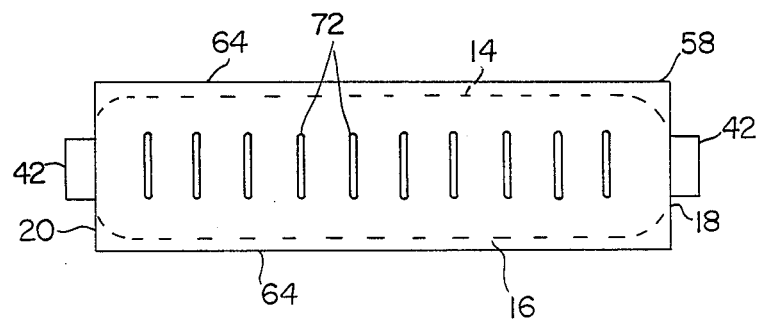
FIG. 4 is a bottom view of the applicator.

FIG. 4 is a bottom view of the applicator 10 showing the patterned plate 58. Although the view is taken from the bottom of the plate, the top of the plate is substantially the same as the bottom. The plate 58 is formed of a metallic or other material which is impervious to the solder paste used in the applicator. The plate has a pattern of holes 72 which corresponds to the solder pattern to be deposited on the circuit board. The pattern may be formed in any known manner, such as by filling in holes in a mesh or screen, or by stenciling a plate.

The side walls 14, 16 are shown in dotted lines. The plate 58 terminates at the end walls 18, 20. The U-shaped sides 64 extend beyond the outer periphery of side walls 14 and 16.

While the plate 58 has been described in a preferred embodiment as being removably mounted to the housing, it may also be permanently secured to the housing.

The operation of the invention will now be described with reference to FIGS. 5 through 8.

Figure 5:
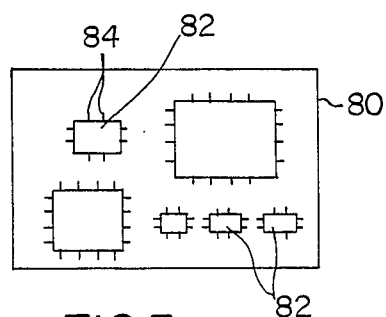
FIG. 5 is a top view of a circuit board including surface mounted components.
Figure 6:
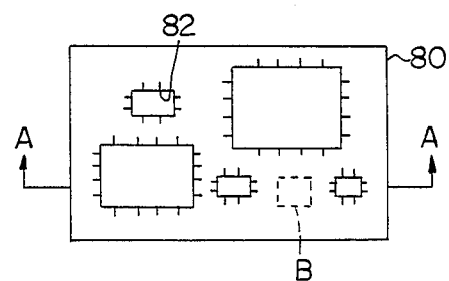
FIG. 6 is a top view of the board of FIG. 5 with one surface mounted component removed.

FIG. 5 illustrates a top view of a circuit board 80 of any well known construction such as epoxy-glass or polyimide laminate with surface mounted electronic components 82 joined to the board by solder connections 84. In FIG. 6 the identical board is shown with one of the components 82 having been removed therefrom. The area from which the component has been removed is shown in dotted lines as "B". The component cannot be replaced and resoldered to the board using standard soldering apparatus since the surface of the board is no longer planar due to the presence of additional surface mounted components.

By means of the solder paste applicator 10, one or more components may be replaced in a small area such as between components on a "populated" circuit board. Since the plate 58 forms a part of the applicator and incorporates the pattern of the solder paste to be applied, very little clearance area is required around the area on the surface where the solder is to be applied. Thus, the solder paste can be printed in close proximity to other electronic components already mounted on the circuit board. The plate 58 is removable so that a number of plates may be patterned to correspond to particular solder designs.

While the housing 12 and the plate 58 have been described as having generally rectangular configurations, other shapes may be used, such as circular or D-shaped, depending on the particular component replacement location and solder pattern required.

The reservoir 56 is filled with solder paste 60 by placing the applicator 10 so that the open bottom section 40 is facing upwardly. The piston 44 is positioned in the housing 12 adjacent the inner surface of the top 22. The reservoir 56 is filled with sufficient solder paste to complete one or more solder printings.

In order to effect uniform dispensing of the solder paste, air bubbles are removed from the paste by vacuum desiccation and/or ultrasonic agitation. Since typical solder pastes are thixotropic and non-Newtonian in nature, the paste 60 will not flow out of the housing reservoir 56 when the housing is inverted to its operating position until the piston 44 applies sufficient force to the paste to overcome the thrushold force required for extrusion. In view of this advantage, such a thixotropic solder is preferred.

The plate 58 is positioned in the applicator 10 by inserting the sides of the plate into the grooves 68 and sliding the plate along the grooves until the plate covers the bottom section 40. The screws 54 are loosened and the legs 42 are slid past the ends of the end walls 18, 20 a distance which corresponds to the desired thickness of the solder to be applied to the board. The screws 54 are then tightened. In this particular embodiment, the distance is approximately 0.004 inches. Typical application thicknesses range from approximately 4 to 7 mils, but any thickness may be appliedllied by proper placement of the legs 42. The amount of paste that is extruded is controlled by the magnitude and duration of force that is applied by the piston 44 to the paste 60.

Figure 7:
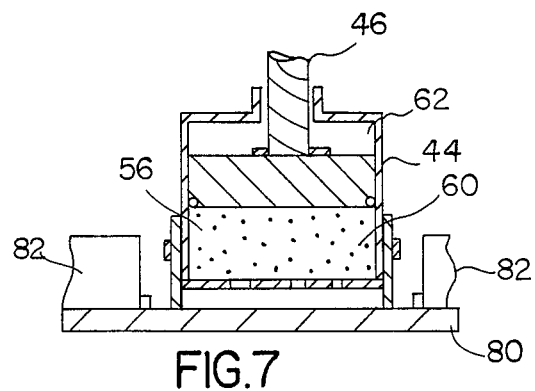
FIGS. 7 and 8 are cross-sectional views of the circuit board of FIG. 6 taken along the line A—A with the solder paste applicator positioned thereon prior to and during application of a solder paste, respectively.

Reference will now be made to FIG. 7 which is a cross-sectional view of the board of FIG. 6 taken through the line A—A thereof. After the reservoir 56 is filled with solder paste and the legs secured in position, a rotatable member, such as a handle, (not shown) is joined to the shaft 46. The applicator 10 is then inverted onto the board 80 covering area "B" where the solder paste is to be reapplied as shown in FIG. 7.

The member is rotated in a clockwise direction causing the shaft to move in a direction toward the reservoir 56, thereby applying force to the piston 44. The force applied to the piston 44 will cause it to move in the direction of the plate 58 and thus apply pressure to the quantity of solder paste in the reservoir 56.

The use of a piston will help ensure extrusion of the solder paste through the patterned plate 58 at a uniform rate and with a uniform pressure.

Figure 8:
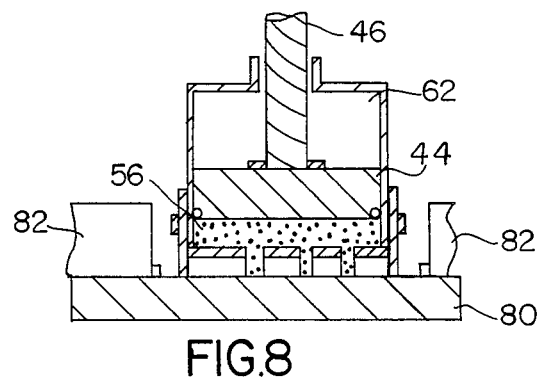

Turning of the shaft 46 continues until the solder paste 60 is pressed out of the holes 72 in the plate 58 in the predetermined pattern and to the requisite depth as shown in FIG. 8. The amount of pressure and duration of application required to achieve the desired paste depth will be determined beforehand by experimentation. At that point, turning of the shaft 46 ceases, and the applicator 10 is lifted off of the board 80.

Although the method of applying a driving force to the piston is described as using a threaded shaft, force may also be applied to the piston by connecting a hose to the cylindrical wall 50. The hose is connected at its other end to a source of pressurized fluid, such as air. Pressurized air is then forced into the chamber 62 until sufficient force is applied against the piston to move it towards the plate 58. Air is continued to be forced into the chamber until sufficient solder has been deposited on the circuit board. At that point the pressure in the hose is released, and the pressure in the chamber 62 is permitted to flow out of the chamber and into the hose until ambient pressure is restored in the chamber. The chamber 62 may also be provided with a vent for release of the pressure.

Another method of applying a driving force to the piston is by means of a non-compressible fluid, such as water.

As the piston 44 stops moving, so does the flow of paste due to its thixotropic nature. The applicator 10 is then lifted from the surface of the board and placed at the next location.

Since the solder paste may contain a volatile medium, timing between solder paste application and component placement becomes critical. A station employing the solder paste applicator of this invention may be placed in an assembly line directly before component placement machines, thus assuring a minimum time interval between solder paste application and component placement.

The solder paste applicator may be operated manually or automatically, such as by a robot. In the case of robotic operation, a robot arm engages the outer surface of the wall 50 by standard robotic means.

The solder paste applicator may be used to apply solder paste to individual or partial land patterns for surface mount electronic devices. A separate plate could be patterned for each component on a board. The applicator can be used for both initial circuit board production and repairs on populated printed circuit boards.

While I have described above the principles of my invention in connection with specific apparatus, it is to be clearly understood that this description is made only by way of example and not as a limitation to the scope of my invention as set forth in the objects thereof and in the accompanying claims.

What is claimed is:

1. Apparatus for applying solder paste to a surface comprising:
    a housing having one end, an opposed open end and a side wall joining said one end and said open end;
    a plate removably positioned in said open end, said plate having a plurality of holes therethrough arranged in a predetermined pattern;
    a reservoir located in said housing adjacent said plate for holding a solder paste material;
    leg means slidably secured to said side wall and extending beyond said open end for supporting said housing on the surface, said means being movable in order that said plate is positioned a predetermined distance from the surface which distance is substantially equal to the thickness of the solder paste material to be deposited on the surface; and
    means located in said one end for dispensing the solder paste material from said reservoir, through said holes and onto the surface.

2. The apparatus of claim 1 wherein said dispensing means includes a piston positioned adjacent said reservoir.

3. The apparatus of claim 2 wherein said dispensing means further includes a shaft having one end extending through an opening in said one end of said housing and having another end joined to said piston, and means for moving said shaft and said piston toward said plate in order to apply force to said reservoir.

4. The apparatus of claim 3 wherein said shaft is threaded and wherein said opening is bounded by a wall having an inner surface which is threaded for engagement with said shaft.

5. The apparatus of claim 2 wherein said dispensing means includes a source of fluid, a tube having a terminal portion joined to said source and an opposed terminal portion extending into said one end of said housing through an opening therein, said source applying force to said piston in order to move said piston against said reservoir.

6. The apparatus of claim 5 wherein said fluid is pressurized air.

7. The apparatus of claim 5 wherein said fluid is a non-compressible fluid.

8. The apparatus of claim 1 wherein said housing has an indentation extending parallel to said open end along at said side wall.

9. The apparatus of claim 8 wherein said plate has U-shaped longitudinal edges and wherein said edges engage said indentation when said plate is positioned in said housing.

10. The apparatus of claim 1 further comprising means for removing air bubbles from the solder paste material.

11. The apparatus of claim 10 wherein said removing means includes an agitator.

12. A method of applying solder paste to a printed circuit board comprising the steps of:
   filling a reservoir housed in a chamber with a solder paste;
   forming a predetermined pattern of holes in a plate;
   positioning the plate at one end of the chamber adjacent the reservoir;
   affixing slidable leg means to the chamber for positioning the plate a predetermined distance from a surface of the board during the applying operation;
   positioning the one end of the chamber on a surface of the board to be soldered; and
   applying pressure to the paste to force the paste to extrude through the holes and to deposit on the board to a thickness corresponding substantially to the predetermined distance and in the predetermined pattern.

13. The method of claim 12 further comprising the step of removing air bubbles from the solder paste after the filling step.

14. The method of claim 13 wherein the removing step includes either one of a vacuum desiccating procedure or an ultrasonic agitation procedure.

15. The method of claim 13 wherein the removing step includes ultrasonic agitation and vacuum desiccation of the solder paste.

16. The method of claim 13 wherein the applying step includes directing force against a piston which is positioned in the reservoir by rotating a threaded shaft which is joined to said piston.

17. The method of claim 13 wherein the applying step includes directing pressurized fluid against a piston which is situated in the reservoir.

* * * * *